United States Patent [19]

Leung et al.

[11] Patent Number: 5,705,080
[45] Date of Patent: Jan. 6, 1998

[54] PLASMA-INERT COVER AND PLASMA CLEANING PROCESS

[75] Inventors: Cissy S. Leung, Fremont; Lawrence Chung-Lai Lei, Milpitas; Sasson Somekh, Los Altos Hills, all of Calif.

[73] Assignee: Applied Materials, Inc., Santa Clara, Calif.

[21] Appl. No.: 271,134

[22] Filed: Jul. 6, 1994

[51] Int. Cl.⁶ ............................................. H01L 21/00
[52] U.S. Cl. .................. 216/67; 156/643.1; 156/646.1; 216/79; 427/585
[58] Field of Search ................. 156/345 P, 643.1, 156/646.1; 216/67, 79; 427/585

[56] References Cited

U.S. PATENT DOCUMENTS

| | | | |
|---|---|---|---|
| 4,397,724 | 8/1983 | Moran | 156/345 P |
| 4,473,455 | 9/1984 | Dean et al. | 156/345 P |
| 4,633,812 | 1/1987 | Fujiyama | 156/345 P |
| 5,047,115 | 9/1991 | Charlet et al. | 156/345 P |
| 5,207,836 | 5/1993 | Chang | 134/1 |
| 5,240,555 | 8/1993 | Kilburn | 156/643 |
| 5,405,491 | 4/1995 | Shahuandi et al. | 156/345 P |

FOREIGN PATENT DOCUMENTS

0511733A1 11/1992 European Pat. Off. .
5-055184 3/1993 Japan ................ H01L 21/302

OTHER PUBLICATIONS

Anon., "Thermally Conductive Electrical Isolation Wafer," Derwent Publications Ltd., London; Class L03, AN 89-098219, Abstract and Research Dsclosure, vol. 298, No. 043, 10 Feb. 1989, Emsworth, GB.

*Primary Examiner*—T. Tung
*Attorney, Agent, or Firm*—Raymond Kam-On Kwong; Charles E. Krueger

[57] ABSTRACT

A process for removing deposits from within a space at least partially delimited by a surface which is subject to attack from a plasma includes the steps of placing on the surface a cover comprising a material which is inert to the plasma, and then removing the deposits.

20 Claims, 6 Drawing Sheets

```
┌─────────────────────────────────────────────┐
│ INTRODUCING INTO A HEATED VACUUM DEPOSITION │
│ CHAMBER HAVING TUNGSTEN OR TUNGSTEN         │
│ SILICIDE DEPOSITS THEREIN A COVERING WAFER  │
│ COMPRISING ALUMINUM OXIDE OR ALUMINUM       │
│ NITRIDE                                     │
└─────────────────────────────────────────────┘
                      │
┌─────────────────────────────────────────────┐
│ HOLDING THE COVERING WAFER WITHIN THE       │
│ VACUUM DEPOSITION CHAMBER ABOVE A HEATER    │
│ PLATE THEREIN FOR A TIME SUFFICIENT TO PERMIT│
│ THE TEMPERATURE OF THE COVERING WAFER TO    │
│ INCREASE SUCH THAT THE RISK OF THERMAL      │
│ SHOCK DAMAGE THERETO IS REDUCED             │
└─────────────────────────────────────────────┘
                      │
┌─────────────────────────────────────────────┐
│ COVERING AT LEAST A PORTION OF THE HEATING  │
│ SURFACE OF THE HEATER PLATE WITH THE        │
│ COVERING WAFER                              │
└─────────────────────────────────────────────┘
                      │
┌─────────────────────────────────────────────┐
│ FLOWING A GASEOUS SOURCE OF FLUORINE INTO   │
│ THE VACUUM DEPOSITION CHAMBER               │
└─────────────────────────────────────────────┘
                      │
┌─────────────────────────────────────────────┐
│ IGNITING A PLASMA IN THE VACUUM DEPOSITION  │
│ CHAMBER WHILE THE GASEOUS SOURCE OF         │
│ FLUORINE IS FLOWING THEREIN AND REACTING    │
│ WITH THE DEPOSITS                           │
└─────────────────────────────────────────────┘
```

*Fig. 9*

PLASMA-INERT COVER AND PLASMA CLEANING PROCESS

BACKGROUND OF THE INVENTION

1. Field of the Invention

The invention relates to the processing of materials, for example semiconductor wafers, in an enclosed space such as a vacuum deposition chamber. More specifically, this invention relates to an improved cleaning process for the removal of deposits, such as tungsten or tungsten silicide deposits, from a vacuum deposition chamber.

2. Description of the Related Art

In the processing of a semiconductor wafer to form integrated circuit structures therein, it is desirable to deposit materials such as tungsten on the wafer by a chemical vapor deposition (CVD) process, either by a blanket deposition followed by etching or chemical mechanical polishing, or by selective deposition of tungsten over a mask layer, such as an oxide layer, already patterned to expose silicon or aluminum surfaces on which the tungsten will selectively deposit.

In either case, deposits of materials such as tungsten usually accumulate within the vacuum deposition chamber, for example on the exposed surface of a heating plate within the chamber, and on a susceptor (a base or support, other than the surface of a heating plate, on which a semiconductor wafer can be placed during the deposition). Such deposits must be removed periodically, since they tend to change the dimensions of the chamber as well as to flake off the exposed surfaces and onto the wafer being processed in the chamber, or change the deposition environment chemically, especially for subsequent selective deposition processes. Such changes may materially affect the CVD process.

Previously, it has been conventional to remove such deposits using a plasma-assisted etch, in particular a fluorine etch. A gaseous source of fluorine is fed into the vacuum deposition chamber and a plasma is then ignited in the chamber during the gas flow, by connecting to an RF source the showerhead through which gases are fed into the vacuum deposition chamber during the deposition. The heater plate, susceptor or other surface on which the wafer normally rests during the deposition process are grounded. Fluorine reacts with the deposits, such as tungsten or tungsten silicide, and the resulting gaseous reaction products are removed from the chamber by the vacuum evacuation system. Such a process satisfactorily removes tungsten or other deposits from the susceptor in the vacuum chamber.

An improved cleaning process is disclosed in U.S. Pat. No. 5,207,836, to Chang. The Chang process provides a subsequent step of flowing a gaseous source of hydrogen through the chamber while maintaining a plasma in the chamber. This additional step removes any fluorine residues which remain in the chamber, and thus prevents such residues from interfering with subsequent tungsten depositions therein.

However, the known processes suffer from certain drawbacks. Typically, chamber cleaning is performed after each wafer is processed. Wafer throughput is thereby reduced due to the time required to set up and carry out the plasma cleaning step and the subsequent pump and purge steps after each wafer is removed from the chamber. Reduced wafer throughput results in increased production costs.

An additional serious drawback of the known processes is the degradation of elements within the vacuum deposition chamber upon exposure to plasma during the cleaning step. In particular, fluorine plasmas attack aluminum elements, such as heater plates, forming AlF on the surface thereof. Surface AlF deposits act as sources of particles which can interfere with subsequent wafer processing. Furthermore, since AlF is an insulating material, the presence of an AlF layer on the heater plate will affect the wafer processing temperature and thus the rate and uniformity of film deposition on the wafer.

One proposed solution to the foregoing problem has been to lengthen the interval between chamber cleanings. Performing chamber cleaning after every 25 to 50 wafers are processed reduces the overhead time and thus the cost of ownership. However, delayed chamber cleaning does not resolve the problems caused by plasma attack on exposed elements, such as aluminum heater plates, within the chamber and consequential formation of deposits such as AlF thereon.

Periodic cleaning processes utilizing low-temperature plasmas have been employed. However, such processes still do not completely resolve all plasma attack problems. Mechanical cleaning processes (i.e., scraping) have also been employed, but are often unsatisfactory in failing to remove all deposits and in potentially damaging the heater plates.

Aluminum wafers have been employed for protection of anodized aluminum chuck surfaces during etching processes. Such wafers would be unsuitable to protect aluminum heater plates from plasma attack during cleaning, however, since they would also be subject to plasma attack.

It would therefore be desirable to provide a cleaning process for an enclosed space, such as a vacuum deposition chamber, which reduces overhead time and avoids formation of harmful deposits on elements within the enclosed space, such as heater plates within a vacuum deposition chamber.

SUMMARY OF THE PREFERRED EMBODIMENTS

In accordance with one aspect of the present invention, there is provided a process for removing deposits from within a space at least partially delimited by a surface which is subject to attack from a plasma. The process comprises the steps of placing on the surface a cover comprised of a material which is inert to the plasma, and removing the deposits, preferably by etching with the plasma. The inert cover protects the underlying surface from attack by the plasma. Being inert to the plasma, the cover can be used repeatedly. Moreover, since the underlying surface is protected from plasma attack, the plasma power during plasma clean can be increased, affording shortened cleaning times.

The inventive process thus makes possible the cleaning of spaces, such as vacuum deposition chambers having aluminum heating elements disposed therein, less frequently, and in a shorter time, than known cleaning processes. Chamber throughput, and hence economy of operation, is correspondingly increased.

Methods for processing semiconductor wafers in a vacuum deposition chamber, including deposition and etching processes, which include the novel method for removing deposits, are also provided.

In accordance with another aspect of the present invention, there is provided a covering wafer comprised of a material which is inert to a plasma used to remove deposits from a vacuum deposition chamber comprising a heater plate after processing of a semiconductor wafer therein.

According to yet another aspect of the present invention, there is provided an apparatus for processing semiconductor wafers which comprises a vacuum deposition chamber including a heater plate, and a covering wafer as described above.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which

FIG. 9 is a flowsheet illustrating a cleaning process of the invention.

In the figures, like elements are numbered like throughout.

DETAILED DESCRIPTION OF THE PREFERRED EMBODIMENTS

In the following detailed description, reference will be made to a preferred embodiment of the invention in which the space is defined by a vacuum deposition chamber including therein a heater plate, in particular an aluminum or aluminum alloy heater plate. Semiconductor wafers are processed within the vacuum deposition chamber using a variety of processes, including etching processes and vapor deposition processes such as CVD. An exemplary CVD process comprises heating the wafers, followed by depositing a material such as tungsten thereon.

An example of such a vacuum deposition chamber, which is particularly suitable as a subject for practice of the present invention, is disclosed in Lei et al., U.S. patent application Ser. No. 08/200,079, the contents of which are incorporated herein by reference. However, the present invention is not to be considered to be limited in its application to vacuum deposition chambers, or to protection of plasma-sensitive surfaces from specific processes such as etching or tungsten CVD processes.

In particular, the term "vacuum processing chamber" is used herein to denote a chamber suitable for carrying out vacuum deposition, etching or other processes.

Figure 1:
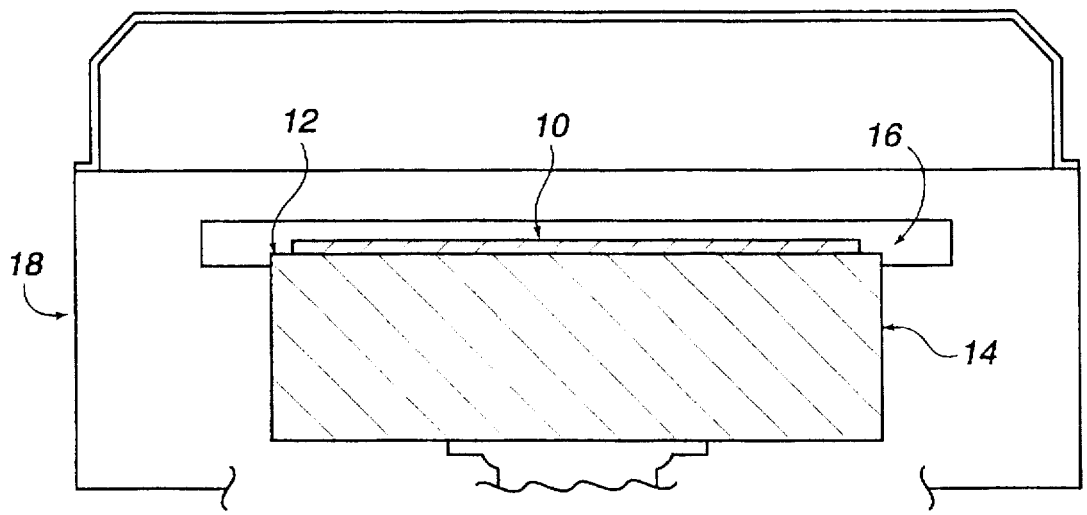
FIG. 1 is a cross-sectional representation of an embodiment of the inventive cover positioned on a heater plate within the vacuum deposition chamber of a vacuum deposition apparatus.

FIG. 1 illustrates a particular embodiment of a cover 10 according to the invention. Cover 10 is formed in the shape of a wafer sized to protect a portion of the upper surface 12 of heater plate 14 within vacuum deposition chamber 16 of vacuum deposition apparatus 18 (depicted in simplified form). Such a covering wafer 10 is appropriate for use, for example, subsequent to "full deposition" processes in which a material is deposited over the entire surface of a semiconductor wafer, and is also deposited on the exposed portions of the heater plate 14 and on other surfaces within the vacuum deposition chamber 16.

Figure 3:
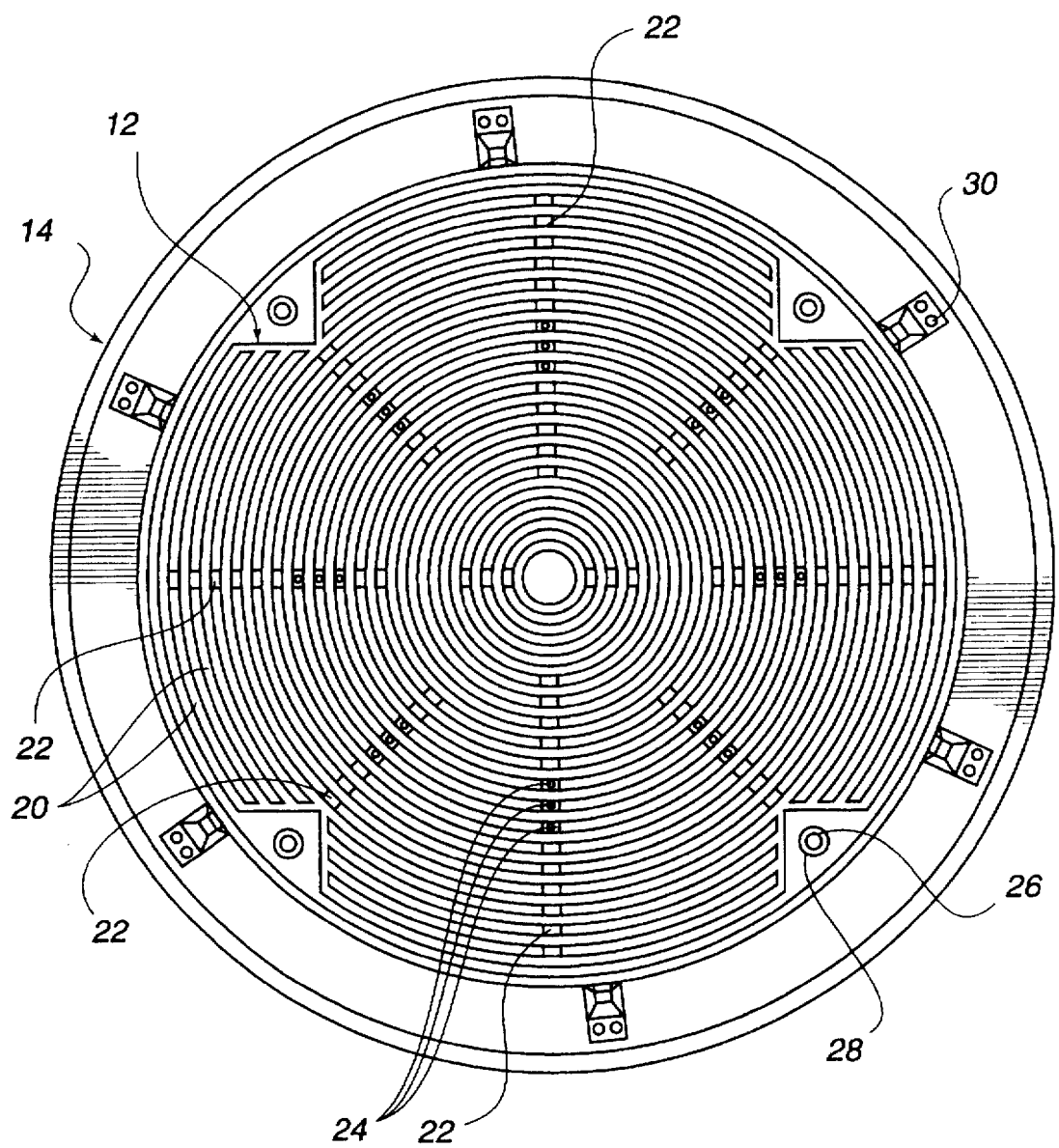
FIG. 3 is a plan view of a typical vacuum deposition chamber heater plate which is advantageously protected using a cover of the invention.
Figure 4:
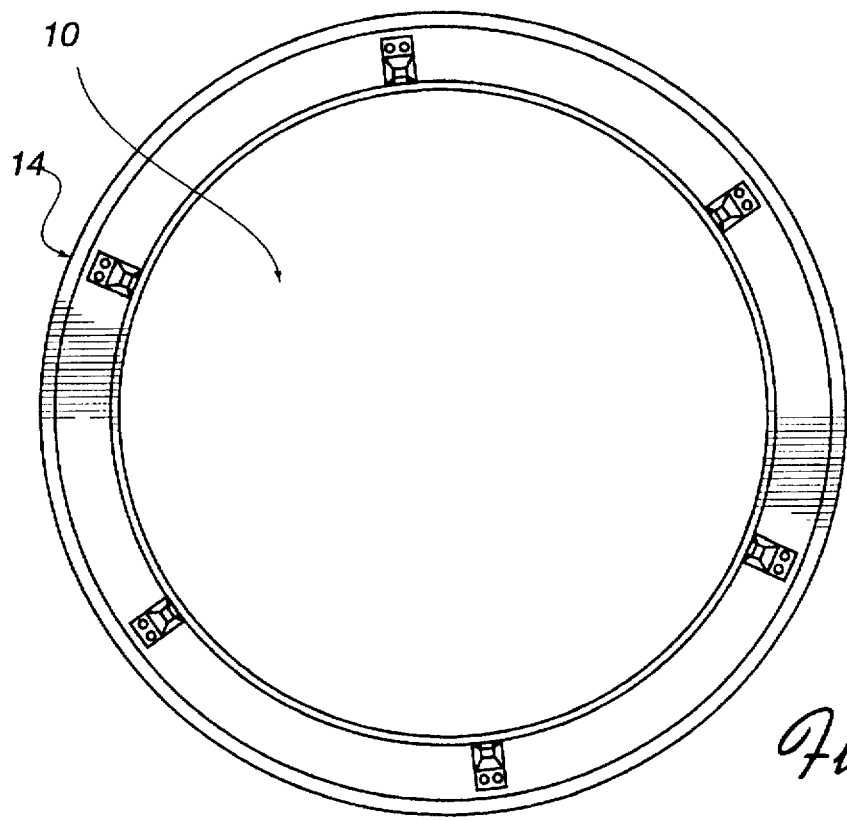
FIGS. 4–7 are plan views of exemplary embodiments of covers of the invention in protective position on various heater plates.
Figure 5:
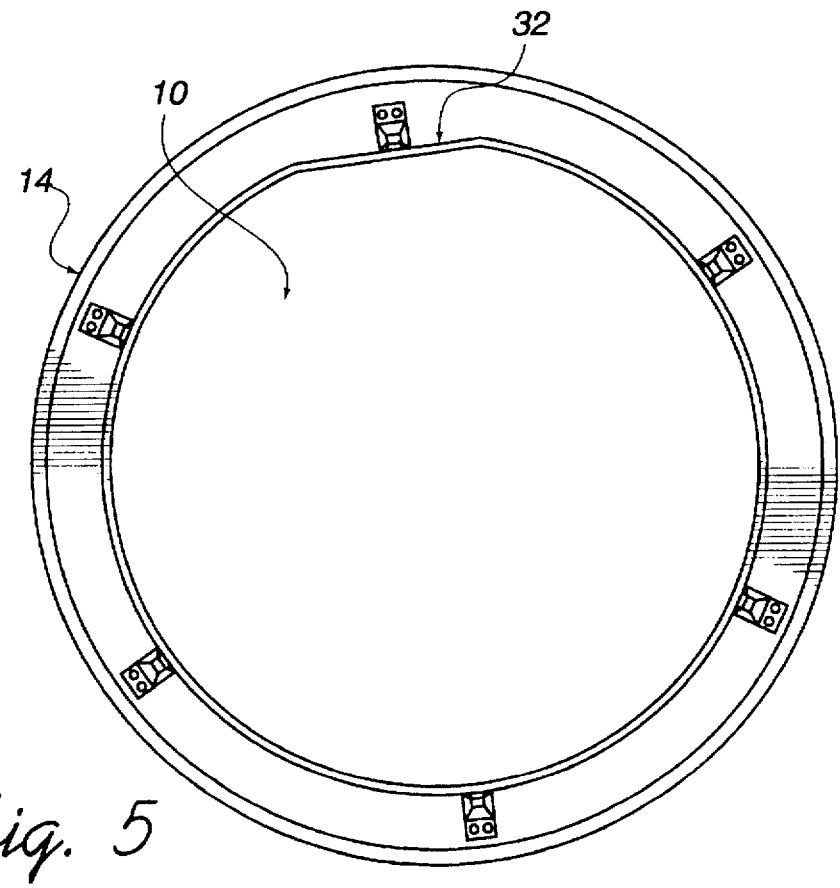
Figure 6:
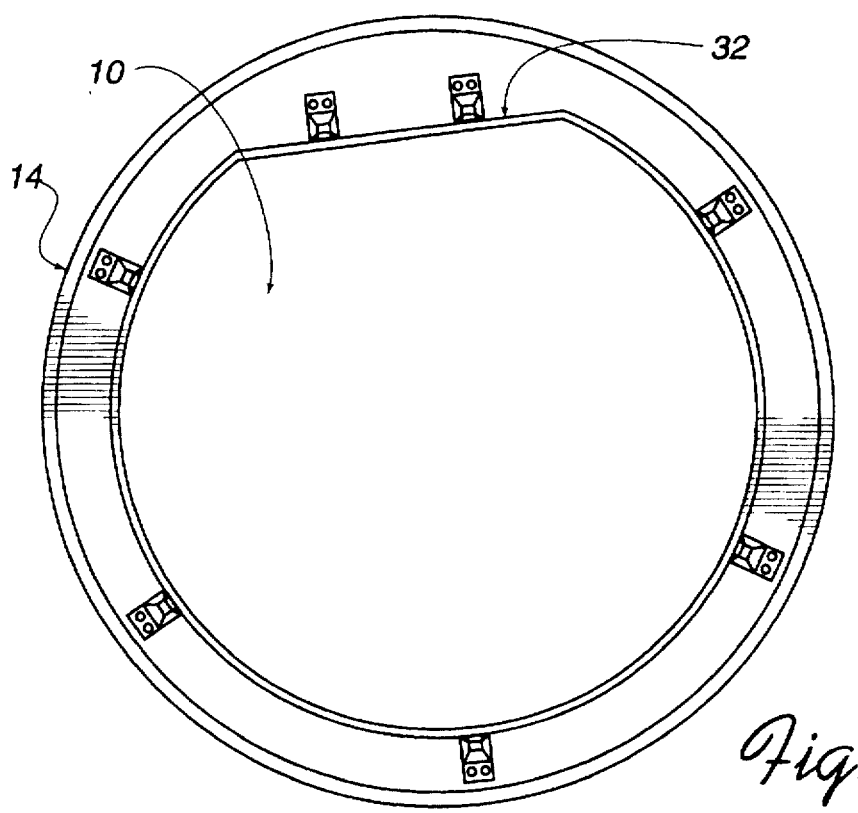

A typical heater plate 14, shown in greater detail in FIG. 3, can comprise on its upper surface 12 various features such as concentric grooves 20, radial grooves 22 having one or more vacuum ports 24 defined therein, bores 26 for receiving support pins 28, and guide pins 30 for facilitating correct placement of semiconductor wafers. One or more of these features can be protected from exposure to plasma by cover 10. Heater plate 14 can have configurations other than the circular configuration of FIG. 3, in order to accommodate wafers having shapes other than circular.

Figure 2:
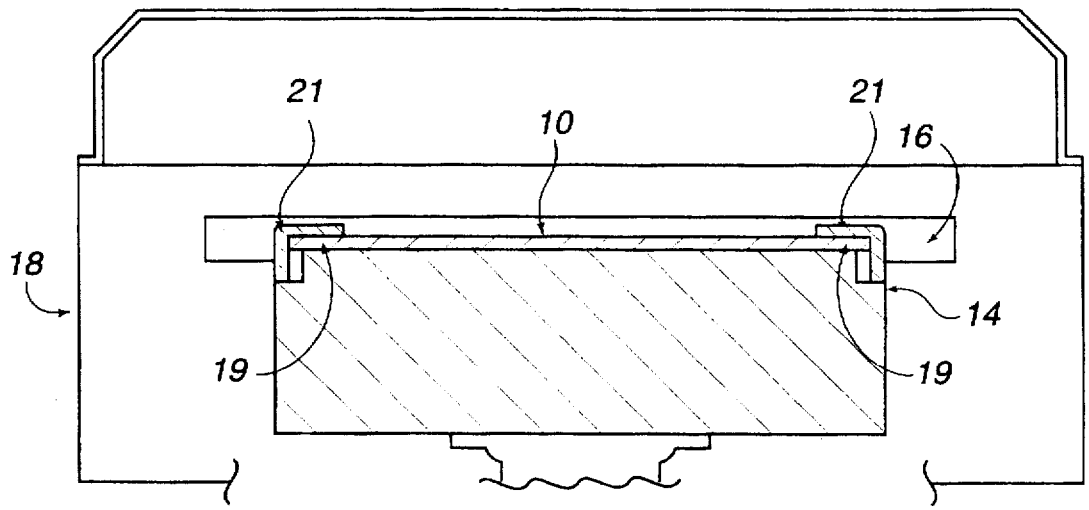
FIG. 2 is a cross-sectional representation of an embodiment of the inventive cover positioned on a heater plate within the vacuum deposition chamber of a vacuum deposition apparatus and partially protected by a shadow plate.

Cover 10 can have any of a variety of shapes and configurations. For example, cover 10 can be so designed that it protects the entire upper surface 12 of heater plate 14. This can be achieved by sizing the cover 10 to cover only the upper surface 12 of heater plate 14, or in the alternative, to extend beyond the edges of heater plate 14. Such an alternative preferred embodiment is illustrated in FIG. 2. In this embodiment, cover 10 extends beyond the upper surface 12 of heater plate 14 and is protected over its outer periphery 19 by shadow plate 21, which typically comprises a ceramic material. This embodiment is appropriate for use subsequent to "exclusion deposition" processes in which a material is deposited only over the surface of a semiconductor wafer which is not protected by shadow plate 21. In exclusion deposition processes, the material is not deposited on any portion of the upper surface 12 of heater plate 14, but only on other surfaces within the vacuum deposition chamber 16 such as shadow plate 21.

Such a cover 10 can also be in the shape of a cap or other structure which is disposed over the entire upper surface 12 of heater plate 14 or a portion thereof, and can be configured to accommodate protruding features such as guide pins 30.

In a particular embodiment, cover 10 can be designed to cover only the portion of upper surface 12 on which semiconductor wafers are disposed during processing. That is, cover 10 can be produced in the form of a covering wafer having substantially the same shape and size as the semiconductor wafers. Thus, in the preferred embodiments illustrated in FIGS. 1 and 4–7, the cover is configured to protect only a portion of the plasma-sensitive upper surface 12 of heater plate 14. In the alternative, when the entire upper surface 12 of heater plate 14 is covered by the semiconductor wafers, or when the semiconductor wafer extends beyond the edges of heater plate 14 as in FIG. 2, cover 10 can likewise be produced to cover or extend beyond the edges of heater plate 14. An advantage of such a covering wafer is that the same handling means used to place the semiconductor wafers within the vacuum deposition chamber 16 (such as a robot blade, not shown) can also be used to place the cover 10 within chamber 16 during cleaning.

Figure 7:
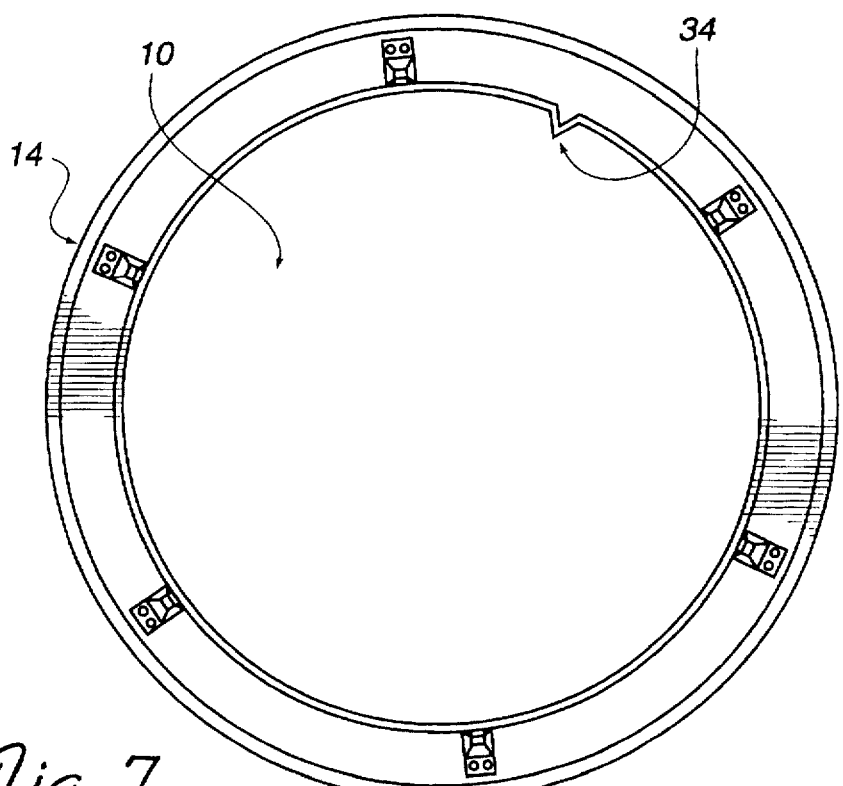

Depending on the particular configuration of the semiconductor wafers which are processed in vacuum deposition apparatus 18, and of the heater plate 14 employed therein, cover 10 can be substantially circular (FIG. 4), or can have one or more flats 32 (FIGS. 5–6, not to scale) or notches 34 (FIG. 7, not to scale). Flats 32 can be relatively narrower (FIG. 5) or wider (FIG. 6), depending on the standard applicable to the semiconductor wafers to be processed. For example, semiconductor wafers produced according to the JEIDA (Japanese) standard have relatively narrow flats, and thus, corresponding covers 10 would also have narrow flats.

A cover according to the invention is comprised of a material which is inert to a plasma used to remove deposits from within the vacuum deposition chamber or other space to be cleaned. One preferred type of plasma-inert material is a ceramic material, for example, an oxide or nitride of a metal such as aluminum, zirconium, cerium or lanthanum. For use in protecting a portion of the heating surface of a heater plate in a vacuum deposition chamber in which semiconductor wafers are processed, it is particularly preferred that the selected material, such as a ceramic material, be resistant to thermal shock. This is because, in such applications, the cover usually is introduced into a high-temperature environment. Typical semiconductor wafer processing temperatures range from about 250° to 650° C. Covers comprised of a material which is resistant to thermal shock are less likely to be damaged upon introduction thereof into the hot environment within the vacuum deposition chamber.

It is also preferable that the selected plasma-inert material used to produce the inventive cover adhere, but not react with, the material or materials, such as tungsten or tungsten silicide, the deposits of which are to be removed from the space, e.g., the vacuum deposition chamber, without generation of particles which can interfere with subsequent deposition processes.

Particularly preferred ceramic materials for use according to the invention are aluminum oxide ($Al_2O_3$) and aluminum nitride (AlN). These materials are highly resistant to thermal shock, and also adhere tungsten and tungsten silicide.

In a preferred embodiment, covering wafers according to the invention for use in protecting vacuum deposition chamber heater plates are designed to account for the coefficient of thermal expansion of the selected plasma-inert material in relation to that of the semiconductor wafer. This is to ensure that the covering wafer covers the desired area at the temperature within the vacuum deposition chamber. For example, aluminum oxide and aluminum nitride have a higher coefficient of thermal expansion than silicon. Thus, covering wafers comprised of aluminum oxide or aluminum nitride preferably are produced slightly smaller in diameter, at ambient temperature, than semiconductor wafers comprised of silicon.

In another alternative embodiment, a cover according to the invention has a composite structure. In this embodiment, a layer of a second material, not necessarily plasma-inert, is coated on at least one side with the selected plasma-inert material. Preferably, the layer of the second material is coated on all sides with the plasma-inert material. For example, a metal wafer can be provided on one or both sides with a layer of a plasma-inert material, forming a sandwich structure. If the second material is not plasma-inert, no portions thereof should be exposed. The various layers comprising such composite covers should be formed from materials having similar coefficients of thermal expansion, in order to ensure that warping or cracking of the composite cover does not occur.

Figure 8A:
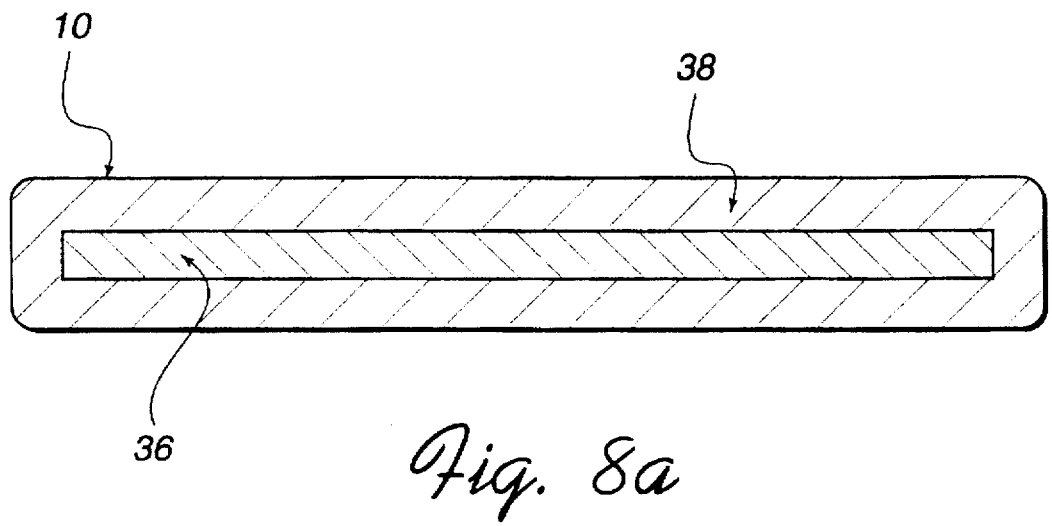
FIGS. 8a–b are cross-sectional views of alternative covers according to the invention which have composite structures.
Figure 8B:
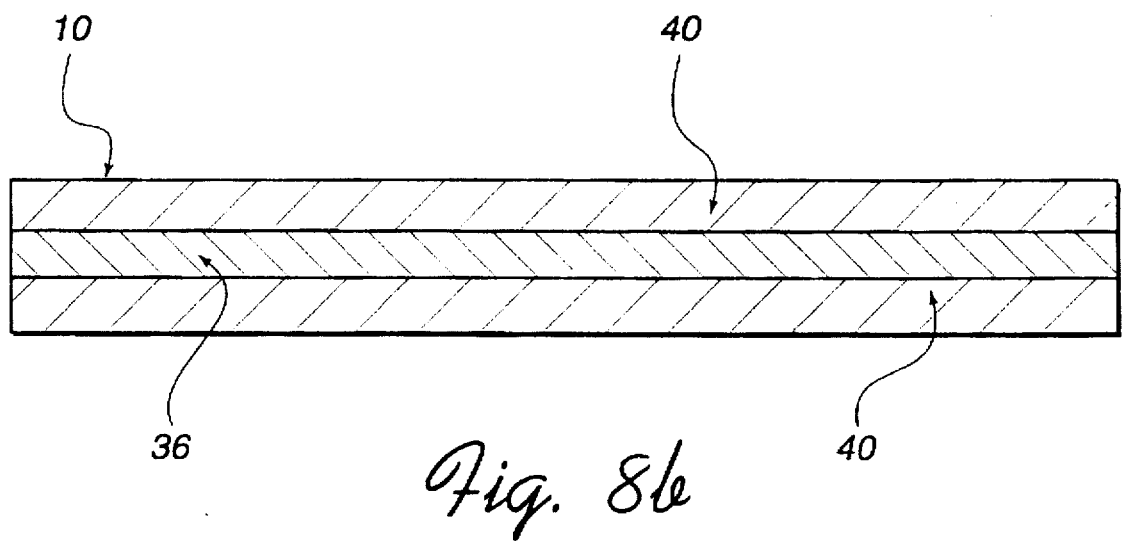

Referring to FIG. 8a, cover 10 has a composite structure with a core layer 36 and a coating 38 of a plasma-inert material. In FIG. 8b, core layer 36 of cover 10 has a layer 40 on each side thereof which comprises a plasma-inert material.

A cover according to the invention, such as a covering wafer, preferably is designed to intimately contact the plasma-sensitive surface such that no spaces are formed into which plasma can penetrate. For example, cover 10 is preferably designed to lie flat on heater plate 14 such that plasma cannot flow beneath cover 10 to come into contact with internal areas of grooves 20 and 22 and vacuum ports 24. Covering wafers having flats 32 or notches 34 thus are preferably disposed on the heater plate 14 such that the flats or notches do not expose any grooves or vacuum ports.

A cover according to the invention, such as a covering wafer, normally will intimately contact the plasma-sensitive surface without being vacuum chucked during removal of deposits, particularly if the selected removal process, i.e., plasma etching process, is carried out at low pressure. However, if desired, the cover, in particular a covering wafer, can be vacuum chucked during a subsequent seasoning step, as discussed in greater detail below.

In an alternative embodiment, the cover can be in the form of a cap for the plasma-sensitive surface. The cap can have the form, for example, of a disk having a peripheral lip or wall to engage a concentric groove of a heater plate, or can include other means to align the cap with respect to the surface to be protected. Such a cap typically would contact the plasma-sensitive surface only at its periphery, leaving a space between the remainder of the cap and the plasmasensitive surface but preventing plasma flow into the space.

Covers according to the invention can be manufactured using any conventional means appropriate to the selected plasma-inert material. Typically, covering wafers can formed from aluminum oxide or aluminum nitride by various processes, including firing, sintering, CVD or plasma spraying. Sintering, for example, can be carried out under high pressure (about 2000–4000 psia, preferably about 2500–3500 psia) and temperature (about 1700°–2000° C.) under an inert atmosphere.

According to another preferred embodiment, a cover according to the invention is provided with a metal layer on at least the surface thereof which is in contact with the plasma-sensitive surface. In the preferred embodiment in which the cover is a covering wafer used to protect a portion of the heating surface of a vacuum deposition chamber heater plate, the metal layer enables placement of the covering wafer on wafer handling means, such as a robot blade, to be detected by a capacitive sensor which is in communication with the robot blade.

The optional metal layer preferably has a thickness from about 100 to 5000 Å, and can be formed by any conventional method, e.g., vapor deposition. Exemplary metals include aluminum and tungsten. Covering wafers can be provided with an optional metal layer on one or both sides. It is preferred that the covering wafer have a peripheral exclusion zone, extending about 2 to 10 mm, preferably about 5 mm from the edge of the wafer, in which the metal layer is not formed. This prevents plasma etching of the metal layer.

A cover according to the invention can be employed to protect a plasma-sensitive surface, such as the upper surface of an aluminum heater plate, or a portion thereof, in a vacuum deposition chamber, from any plasma etching customarily used to remove deposits. In an exemplary process in which a cover 10 as illustrated in FIG. 1 is employed, deposits on the exposed upper surface 12 of heater plate 14, along with other surfaces within vacuum deposition chamber 16, are removed. In another exemplary process in which a cover 10 as illustrated in FIG. 2 is employed, only deposits on shadow plate 21 and other surfaces within vacuum deposition chamber 16 are removed. In such a process, shadow plate 21 and cover 10 are normally maintained in spaced relationship, achieved, for example, by at least partially retracting cover 10 on heater plate 14 from contact with shadow plate 21.

In a more specific exemplary process, a gas capable of reacting with the deposits to be removed is flowed into the space to be cleaned, e.g., the vacuum deposition chamber. Then a plasma is ignited in the space while the gas is flowing and reacting with the deposits on the exposed surfaces.

The gas employed in the etching process typically is a gaseous source of a halogen, such as fluorine or chlorine. Preferably, the gas is a gaseous source of fluorine, such as $NF_3$, $SF_6$, $CF_4$ or $C_2F_6$. $NF_3$ is particularly preferred. Other gases which are employed in plasma etching processes are also contemplated as being useful according to the present invention. A mixture of gases can also be employed. An inert or non-reactive diluent gas, such as argon, neon or helium, can also be combined with the gas or mixture of gases.

The appropriate flowrate of the gas (or gases) reactive with the deposits to be removed, and temperature and pressure conditions within the vacuum deposition chamber or other space, can readily be determined by one of ordinary skill in the art, taking into account the volume of the space from which deposits are to be removed, the quantity of deposits to be removed, among other conventional factors. Typical process parameters are set forth in Chang, U.S. Pat. No. 5,207,836, the entire disclosure of which is incorporated herein by reference.

Use of a cover according to the invention permits the use of a plasma having a wider range of power than the plasmas conventionally employed. Plasma powers within the range from about 50 to 2000 watts can be employed, preferably 600 to 2000 watts, in particular 600 to 1000 watts. For example, when a vacuum deposition chamber including a heating plate with a diameter of 6" (150 mm) is to be treated, a preferred plasma power is 600 watts. When the heating plate has a diameter of 8" (200 mm), a preferred plasma power is 1000 watts.

The higher plasma power levels made possible by the instant invention can result in shorter plasma etching times. Typically the plasma etching step is carried out for a period of time within a range from about 10 seconds to 600 seconds. For a plasma power of 600 watts, the plasma etching step can preferably be carried out for about 10 to 300 seconds, depending on the quantity of deposits to be removed.

If desired, an optional additional step of removing any residues, such as fluorine residues, remaining from the plasma etching step can be carried out after the etching step. Processes including such additional removal steps are described, for example, in Chang, U.S. Pat. No. 5,207,836.

As mentioned previously, the space into which the inventive cover is introduced may be at an elevated temperature. This is particularly true when the inventive cover is a covering wafer to be employed to protect a heating plate in a vacuum deposition chamber in which semiconductor wafers are processed. Such processing typically takes place at temperatures of about 400°–490° C. and pressures of about 1–100 Torr. Use of a material which is resistant to thermal shock minimizes the damage to the cover which could result from a sudden change in temperature. In order to further eliminate damage due to thermal shock, it is preferred that the cover be held within the space and above (or otherwise out of direct contact with) the plasma-sensitive surface for a time sufficient to permit the temperature of the material to increase such that thermal shock damage to the cover is prevented. After the cover has been heated in this manner, it is then placed in contact with the plasma-sensitive surface.

For example, a covering wafer can be introduced into a vacuum deposition chamber and maintained (by conventional means such as a robot arm or support pins) at a height of about 0.005 to 0.1 inch, preferably about 0.08 inch (2 mm) above the heating surface of the heater plate to be protected. After about 20 to 30 seconds, the temperature of the covering wafer has slowly increased to a level such that it can safely be placed on the heater plate without substantial risk of thermal shock damage to the covering wafer.

In the alternative, the cover can be pre-heated prior to introduction to the space having the plasma-sensitive surface to be protected. This embodiment can permit production of a cover from a material having a lesser resistance to thermal shock.

An exemplary process embodying various of the foregoing features is illustrated in the flowsheet of FIG. 9.

A cover according to the present invention can be employed as part of a method for processing semiconductor wafers in a vacuum deposition chamber which includes one or more wafer processing steps followed by a cleaning step. The semiconductor processing method can be, for example, a deposition process or an etching process. Thus, a semiconductor wafer can be subjected to deposition, such as chemical vapor deposition, or to etching, and then removed from the vacuum deposition chamber. Preferably, one or more additional semiconductor wafers are subsequently processed in the same manner in the vacuum deposition chamber. Particularly preferably, a total of 25 to 50 semiconductor wafers are so processed. After the semiconductor wafer or wafers have been processed, deposits produced during the deposition or etching process are removed in the manner described above. A covering wafer is introduced into the vacuum deposition chamber and placed on the heating surface of a heater plate within the chamber. The deposits within the chamber are then removed by plasma etching. Residues, such as fluorine residues, can also be subsequently removed. The semiconductor wafer processing method can then be repeated.

In a preferred embodiment of a deposition process as described above, subsequent to the plasma etching step, the vacuum deposition chamber is seasoned. Seasoning is carried out by introducing into the chamber a predetermined trace amount of the material, such as tungsten or tungsten silicide, which accumulates within the chamber during processing. The seasoning step ensures a more uniform semiconductor wafer processing environment. Seasoning typically is carried out in the presence of the cover, but can also be carried out after removal of the cover from the chamber.

Seasoning can be carried out in one or more steps. For example, when semiconductor wafers are processed using a full coverage deposition as described above, the seasoning can be carried out using $SiH_4$ reduction of $WF_6$ (a step also used in the nucleation step for tungsten deposition on the wafers). The seasoning step deposits a thin layer of tungsten, for example about 800 Å thick, on the covering wafer, as well as on the upper surface of the heater plate which is not protected by the covering wafer and on surrounding surfaces within the vacuum deposition chamber. When semiconductor wafers are processed using an exclusion deposition process as described above, the seasoning preferably is carried out in two steps. The first step uses $SiH_4$ reduction of $WF_6$, as with the preceding seasoning process. This provides a thin tungsten layer (again, typically about 800 Å thick) which adheres well to the ceramic shadow plate and to the covering wafer, which is disposed on the heater plate and on which in turn the shadow plate rests. However, the shadow plate typically requires additional seasoning. Thus, a second seasoning step uses $H_2$ reduction of $WF_6$ for a time sufficient to form a thick tungsten layer on the covering wafer and the shadow plate. In an exemplary seasoning process, the second step is carried out for about 120 seconds, to afford a tungsten film having a thickness of about 12,000 Å. Without the first seasoning step, the tungsten would not adhere well to the shadow plate.

The invention is further illustrated by the following non-limiting examples.

EXAMPLE 1 Covers

A. Aluminum nitride (AlN) covering wafer

Aluminum nitride powder (99.9% purity, free of sintering aids, e.g., $Y_2O_3$, which can be etched by plasma; commercially available from NGK), is sintered under high pressure and temperature under an inert atmosphere into a plate-like shape having a density of about 3.25 g/cm$^3$. A wafer (a disk-like shape) is cut from the plate and is ground, preferably by double-sided grinding, to the desired thickness, which is dependent on the selected wafer diameter. For a diameter of about 200 mm, the thickness preferably is about 1.0 to 1.25 mm. For a diameter of about 150 mm, the thickness preferably is about 0.75 to 1.00 mm. The circumferential edge of the wafer is ground and optionally beveled and/or provided with a flat or notch.

For use with silicon wafers having a diameter of 200 mm, an aluminum nitride covering wafer preferably has a diameter of 200 mm±0.2 mm.

Alternatively, the initial aluminum nitride plate can be produced by chemical vapor deposition of an AlN film, although such a process is more costly than the foregoing sintering process.

B. Aluminum oxide ($Al_2O_3$) covering wafer

Aluminum oxide (preferably at least 99% purity) is formed into a plate-like shape and fired. The plate is then ground, preferably by double-sided grinding, into a rough wafer shape having a thickness of from 0.75 to 1.25 mm, depending on the diameter of the wafer. The circumferential edge of the wafer is ground and optionally beveled and/or provided with a flat or notch.

For use with silicon wafers having a diameter of 200 mm, an aluminum oxide covering wafer preferably has a diameter of 199.5 mm±0.1 mm, to account for the higher coefficient of thermal expansion for aluminum oxide relative to that of silicon.

EXAMPLE 2 Deposition process with cleaning step

The following process is carried out using a Precision 5000 xZ vacuum deposition apparatus, commercially available from Applied Materials, Inc., Santa Clara, Calif. Other commercially available apparatus, such as the Centura xZ of Applied Materials, can also be used.

A. Deposition

A silicon wafer is introduced into the vacuum deposition chamber of the Precision 5000 xZ apparatus and heated to the selected processing temperature of 475° C. After conventional pre-nucleation with $WF_6$ and $Si_4$, chamber purge, pressurization and stabilization of the wafer on the heater plate, tungsten deposition is carried out using $WF_6$ (flowrate 95 sccm) under a pressure of 90 Torr. The wafer is then removed, the chamber is purged and pumped (Ar/$N_2$/$H_2$ purge), and the deposition process is repeated until 25 silicon wafers have been processed.

B. $NF_3$ Plasma Clean

With the heater plate maintained at the selected processing temperature of 475° C., an aluminum nitride covering wafer is introduced into the vacuum deposition chamber and heated over a period of 23 seconds. Concurrently or subsequently, $NF_3$ is introduced into the chamber at 150 sccm and a base pressure of 300 mT. After the 23 second heating, the covering wafer is placed on the heater plate such that the area covered by the silicon wafer is protected. Once the covering wafer is in place, a 600 watt plasma is ignited, and $NF_3$ plasma etching is carried out for 227.5 seconds, with plasma power reduced to 200 watts at 225 seconds. After two purge/pump cycles (30 second Ar/$N_2$/$H_2$ purge, 3 second pump per cycle), chamber pressure is reduced to 4.5 Torr, and the chamber is seasoned for 30 seconds with introduction into the chamber of $WF_6$ (10 sccm) and $SiH_4$ (5 sccm). The chamber pressure is then returned to atmospheric pressure. After three purge/pump cycles (3 second Ar/$N_2$/$H_2$ purge, 3 second pump per cycle), the deposition procedure is repeated.

A vacuum deposition apparatus, including a vacuum deposition chamber having a heater plate, together with a cover according to the present invention, thus can enable increased semiconductor wafer throughput and thereby greater economy than conventional devices.

What is claimed is:

1. A chamber cleaning process for removing deposits, formed while processing semiconductor wafers having a major surface of a characteristic shape, from within a space at least partially delimited by a covered area of the surface of a heating surface which is covered by said wafer during processing and is subject to attack from a plasma and with the surface including an uncovered area not covered by the semiconductor wafer during processing, said chamber cleaning process comprising the steps of:

(a) providing a heater plate to define said heating surface, said heater plate having protruding features affixed thereto with said protruding features delimiting the periphery of the covered area on said heater plate and having the characteristic shape of said wafer;

(b) placing on said covered area of the surface a cover having the same characteristic shape of the major surface of said semiconductor wafer, with said cover aligned by said protruding features to completely cover only said covered area and with said cover comprising a material which is inert to said plasma, and (c) removing said deposits from uncovered areas of said surface by a plasma process.

2. The process of claim 1 wherein said material is a ceramic material.

3. The process of claim 2 wherein said material is selected from the group consisting of oxides and nitrides of a metal.

4. The process of claim 3 wherein said ceramic material is selected from the group consisting of aluminum oxide and aluminum nitride.

5. The process of claim 1 wherein said material is resistant to thermal shock.

6. The process of claim 1 wherein said space is a vacuum deposition chamber for processing semiconductor wafers.

7. The process of claim 6, further comprising the step of depositing upon a wafer disposed on said surface a material selected from the group consisting of tungsten and tungsten silicide, thereby forming said deposits.

8. The process of claim 1 wherein at least the portion of said cover in contact with said surface is coated with a metal layer.

9. The process of claim 1 wherein in step (c) said deposits are removed by a plasma etching process comprising the steps of (i) flowing into said space a gas capable of reacting with said deposits, and (ii) igniting said plasma in said space while said gas is flowing therein and reacting with said deposits.

10. The process of claim 9 wherein said gas is a gaseous source of a halogen.

11. The process of claim 10 wherein said gas is a gaseous source of fluorine and is selected from the group consisting of $NF_3$, $SF_6$, $CF_4$, and $C_2F_6$.

12. The process of claim 11 wherein step (c) is carried out for a period of time within a range of from about 10 to about 600 seconds and wherein the power of said plasma varies within a range of from about 50 to about 2000 watts as said gaseous source of fluorine flows through said space.

13. The process of claim 1 wherein said space is heated and wherein said cover is held within said space above said surface for a time sufficient to permit the temperature of said cover to increase such that the risk of thermal shock damage thereto is reduced prior to placement of said cover on said surface.

14. A process for removing tungsten or tungsten silicide deposits from uncovered surfaces of a vacuum chamber, with the vacuum chamber comprising a heater plate having an Al heating surface, after processing of a semiconductor wafer therein, where the wafer has a major surface of a characteristic shape and is disposed on the heating surface during processing to cover a covered area of the heater plate and with tungsten, and tungsten silicide deposits forming on an uncovered area of the heating surface of the heater plate not covered by the semiconductor wafer during processing, the process for removing comprising the steps of:

(a) providing the heater plate with protruding features affixed thereto, said protruding features delimiting the periphery of the covered area on said heater plate and having the characteristic shape of said wafer;

(b) selecting a covering wafer having an upper surface formed of $Al_2O_3$ or AlN which is inert to fluorine plasma etchants and adheres to tungsten or tungsten silicide particles, with the covering wafer having a major surface of the same shape as the characteristic shape of the major surface of the semiconductor wafer;

(c) completely covering the covered area of the heating surface of said heater plate with said covering wafer, with said covering wafer aligned by said protruding features, to prevent the formation of AlF on the covered part of said heating surface during plasma etching to remove deposits, (d) flowing into said vacuum chamber a gaseous source of fluorine capable of reacting with said tungsten or tungsten silicide deposits-and removing said deposits from only the uncovered part of the heater plate and other uncovered surfaces of the vacuum chamber, and (e) igniting said plasma in said vacuum deposition chamber while said gaseous source of fluorine is flowing therein, and reacting with and removing said deposits.

15. A process for removing tungsten or tungsten silicide deposits from uncovered surfaces of a vacuum chamber, with the vacuum chamber comprising a heater plate having an Al heating surface, after processing of a semiconductor wafer therein, where the wafer has a major surface having a characteristic shape and is disposed on the heating surface during processing to cover a covered area of the heater plate and with tungsten and tungsten silicide deposits forming on an uncovered area of the heating surface of the heater plate not covered by the semiconductor wafer during processing, the process for removing comprising the steps of:

(a) providing the heater plate with protruding features affixed thereto, said protruding features delimiting the periphery of the covered area on said heater plate and having the characteristic shape of said wafer;

(b) introducing a covering wafer, having a major surface with the same characteristic shape as the major surface of said semiconductor wafer and comprising a ceramic material selected from the group consisting of aluminum oxide and aluminum nitride, into said vacuum deposition chamber, (c) holding said covering wafer within said vacuum deposition chamber above said heating surface of said heater plate for a time sufficient to permit the temperature of said covering wafer to increase such that the risk of thermal shock damage thereto is reduced, (d) completely covering the covered area of the heating surface of said heater plate with said covering wafer, with said covering wafer aligned by said protruding features, (e) flowing $NF_3$ into said vacuum deposition chamber, and (f) igniting a plasma in said vacuum deposition chamber while said $NF_3$ is flowing therein and reacting with said deposits.

16. A method for processing semiconductor wafers, having a major surface which has a characteristic shape, in a vacuum processing chamber comprising uncovered surfaces and a heater plate having an upper surface including a covered area of the same characteristic shape as the major surface semiconductor wafers, where the method comprises the steps of protruding features affixed thereto, said protruding features delimiting the periphery of the covered area on said heater plate and having the characteristic shape of said wafer;

(b) processing a semiconductor wafer in said vacuum processing chamber, with the semiconductor wafer aligned by said protruding features to be disposed over the covered area of the heater plate to completely cover the covered area during said processing, (c) removing said semiconductor wafer from said vacuum processing chamber, and (d) removing deposits from said vacuum processing chamber by a process which comprises the steps of:

(i) selecting a covering wafer having an upper surface formed of $Al_2O_3$ or AlN which is inert to fluorine plasma etchants and adheres to tungsten or tungsten silicide particles, with the cleaning wafer having a major surface of the same shape as the characteristic shape of the major surface of the semiconductor wafer;

(ii) aligning the covering wafer with said protruding features to completely cover the covered area of the heater plate with said covering wafer to prevent the formation of AlF on the covered part of said heating surface during plasma etching to remove deposits, (iii) flowing into said vacuum chamber a gas capable of reacting with said tungsten or tungsten silicide deposits and removing said deposits from only the uncovered part of the heater plate and other surfaces uncovered surfaces of the vacuum chamber, and (iv) igniting said plasma in said vacuum processing chamber while said gas is flowing therein and reacting with and removing said deposits.

17. The method of claim 16 wherein in step (b) said semiconductor wafer is processed by etching.

18. The method of claim 16 wherein in step (b) said semiconductor wafer is processed by chemical vapor deposition.

19. The method of claim 16 wherein steps (b) and (c) are sequentially repeated about 25 to about 50 times before step (d) is carried out.

20. The method of claim 16 further comprising the step (e) of seasoning said vacuum processing chamber.

* * * * *